(12) United States Patent
Lee

(10) Patent No.: US 10,001,233 B2
(45) Date of Patent: Jun. 19, 2018

(54) VACUUM-PIPE CONNECTING MEMBER FOR DETECTING GAS LEAK

(71) Applicant: SARAMDLE CO., LTD., Hwaseong-si (KR)

(72) Inventor: Jae Hak Lee, Incheon (KR)

(73) Assignee: SARAMDLE CO., LTD., Hwaseong-si, Gyeonggi-Do (KR)

( * ) Notice: Subject to any disclaimer, the term of this patent is extended or adjusted under 35 U.S.C. 154(b) by 276 days.

(21) Appl. No.: 14/795,710

(22) Filed: Jul. 9, 2015

(65) Prior Publication Data

US 2015/0308601 A1    Oct. 29, 2015

Related U.S. Application Data

(63) Continuation-in-part of application No. PCT/KR2014/000331, filed on Jan. 10, 2014.

(30) Foreign Application Priority Data

Jan. 10, 2013  (KR) .......................... 10-2013-0002986

(51) Int. Cl.
| | |
|---|---|
| *F16L 23/10* | (2006.01) |
| *C23C 16/44* | (2006.01) |
| *G01M 3/04* | (2006.01) |
| *H01L 21/67* | (2006.01) |
| *F16L 27/111* | (2006.01) |

(52) U.S. Cl.
CPC .......... *F16L 23/10* (2013.01); *C23C 16/4409* (2013.01); *G01M 3/042* (2013.01); *F16L 27/111* (2013.01); *F16L 2201/30* (2013.01); *F16L 2201/40* (2013.01); *H01L 21/67017* (2013.01)

(58) Field of Classification Search
CPC ... F16L 2201/30; F16L 23/10; F16L 2201/40; F16L 27/111; G01M 3/042; C23C 16/4409; H01L 21/67017
USPC ................... 285/93, 406, 420, 410, 411, 407
See application file for complete search history.

(56) References Cited

U.S. PATENT DOCUMENTS

| | | | | |
|---|---|---|---|---|
| 2,759,175 | A * | 8/1956 | Spalding | .................. 138/104 X |
| 4,468,609 | A * | 8/1984 | Schmitz | |
| 5,330,720 | A * | 7/1994 | Sorbo | ......................... 285/93 X |
| 6,032,699 | A * | 3/2000 | Cochran | ................... 138/104 X |
| 2004/0237632 | A1* | 12/2004 | Van Keeken | ............... 285/93 X |

FOREIGN PATENT DOCUMENTS

| | | |
|---|---|---|
| JP | 2002-082010 A | 3/2002 |
| JP | 2004-183849 A | 7/2004 |
| JP | 2004-225833 A | 8/2004 |
| KR | 10-2008-0040101 A | 5/2008 |
| KR | 1278198 B1 * | 5/2013 |

* cited by examiner

*Primary Examiner* — Gregory J Binda
*Assistant Examiner* — Zachary T Dragicevich
(74) *Attorney, Agent, or Firm* — Novick, Kim & Lee, PLLC; Sang Ho Lee

(57) ABSTRACT

A vacuum pipe connecting member for detecting in real time a gas leak from a pipe connection between vacuum pipes is provided. In one aspect, the vacuum pipe connecting member is provided to include: a clamp for connecting a vacuum pipe to another vacuum pipe or to a semiconductor manufacturing apparatus; and a reactant that is provided in the clamp and is chemically reactive to a gas leaking from the pipe connection.

6 Claims, 6 Drawing Sheets

VACUUM-PIPE CONNECTING MEMBER FOR DETECTING GAS LEAK

PRIORITY CLAIMS AND CROSS-REFERENCE TO RELATED APPLICATION

This patent document is a continuation-in-part application of, and claims priority and benefits of, Patent Cooperation Treaty (PCT) application number PCT/KR2014/000331, entitled "VACUUM-PIPE CONNECTING MEMBER ABLE TO DETECT WHETHER THERE IS A LEAK", filed with the Korean Intellectual Property Office (KIPO) on Jan. 10, 2014, which further claims priority and the benefits of Korean Patent Application No. 10-2013-0002986 filed on Jan. 10, 2013. The entire disclosures of the above applications are incorporated by reference as part of this document.

TECHNICAL FIELD

This patent document relates to a vacuum pipe connecting member. For example, some implementations of the disclosed technology provide a vacuum pipe connecting member for detecting a gas leak from a pipe connection between vacuum pipes used for vacuum pumping in semiconductor manufacturing facilities.

BACKGROUND

An integrated circuit (IC) is a silicon chip that is as thin and small as a fingernail but is filled with tens of thousands of electronic components (such as transistors, diodes, resistors, and/or capacitors).

The electronic components are precisely connected to form logic gates or memory elements. The small electronic components and connections therebetween are all formed by making fine and complicated patterns in a plurality of layers of different materials.

When manufacturing semiconductor devices, several kinds of gases and chemicals are used in chemical vapor deposition (CVD) and etching processes, and apparatuses for the CVD and etching processes need to be maintained in a vacuum to prevent treatment subjects like wafers and substrates and/or parts of the apparatuses from being damaged or contaminated by external gases.

SUMMARY

This patent document provides a vacuum pipe connecting member capable of detecting a gas leak by using a reactant (a chemical or the like) that is chemically reactive to a gas leaking from a clamp or bellows that is used for pipe-fitting of vacuum pipes. Thus, the disclosed technology enables a prompt detection of a gas leak on site or remotely in real time using an additional detecting means or a monitoring device. Therefore, the gas leak can be prevented.

In one aspect, a vacuum pipe connecting member is provided to include: a clamp for connecting a vacuum pipe to another vacuum pipe or to a semiconductor manufacturing apparatus; and a reactant that is provided in the clamp and is chemically reactive to a gas leaking from a pipe connection.

In another aspect, a vacuum pipe connecting member is provided to include: a bellows that freely changes a passage according to a clearance between vacuum pipes or between a vacuum pipe and a pipe of a semiconductor manufacturing apparatus, the clearance being attributable to a pipe connection error occurring when straight pipes are connected; and a reactant that is provided in the bellows and is chemically reactive to a gas leaking from a pipe connection.

In some implementations, the reactant may include a chemical having a composition that causes a color-changing reaction when the reactant reacts with the leaking gas.

In some implementations, the clamp may include: a slit on an outer circumferential surface of a coupling ring that surrounds ends of the vacuum pipes to connect the vacuum pipes to each other; a storage to be filled with the reactant; and one or more through holes, each of which extends from an inner circumferential surface of the coupling ring to the storage portion and is arranged within the slit.

In some implementations, the bellows may be provided with a cover that surrounds the entire area of a corrugated portion of the bellows, and the bellows may have a storage portion to be filled with the reactant. The cover may be made of or include a transparent material so that a chemical reaction of the reactant can be visually confirmed from outside.

Various implementations of the disclosed technology enables prompt detection of a gas leak that may occur during a semiconductor manufacturing process from a pipe connection between vacuum pipes. Thus, if a gas leak occurs, a semiconductor manufacturing process can be immediately stopped, which prevents damage or breakdown of a manufacturing apparatus and protects workers from risks of a gas leak.

In some implementations, it is possible to alleviate an operator's burden of checking each of numerous pipe connections for a gas leak by carrying and using a gas detector. This can significantly reduce time for checking for a gas leak and remove the problems related to hiring necessary people and reduce employment costs.

In some implementations, it is possible to prolong lifetime of semiconductor manufacturing apparatuses or facilities and improve reliability of manufacturing processes. Therefore, the disclosed technology is very useful and highly contributable to the development of a semiconductor manufacturing industry by increasing a production yield of semiconductor devices.

DETAILED DESCRIPTION

Figure 1:
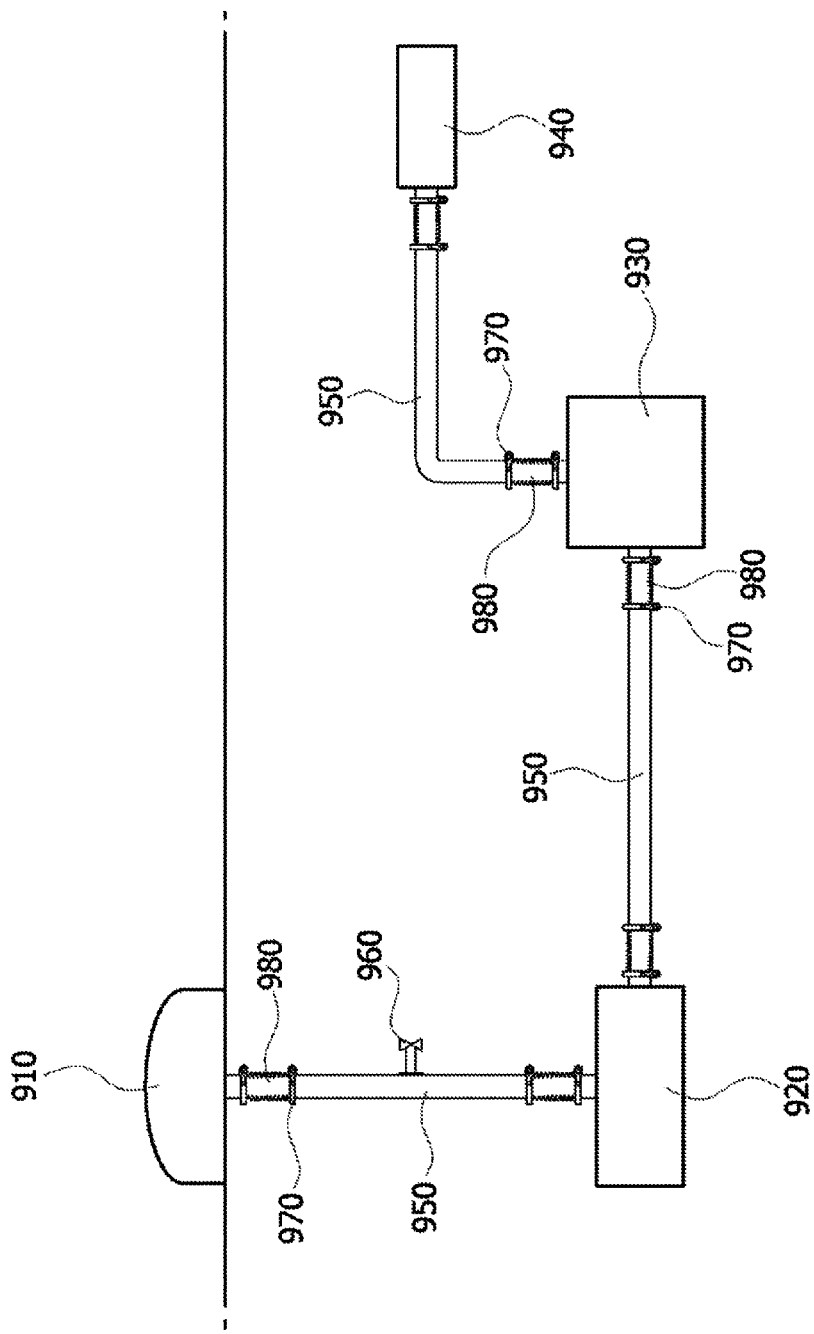
FIG. 1 is an exemplary diagram schematically illustrating a semiconductor manufacturing process facility according to a related art.

As illustrated in FIG. 1, a conventional device includes: a chamber 910 in which a manufacturing process is performed under vacuum conditions; a vacuum pump 920 that creates a vacuum state in the chamber 910; a scrubber 930 that is used to clean a gas discharged from the vacuum pump 910 and removes contaminants from the discharged gas; a duct 940 that releases a clean gas, produced by the scrubber 930, into the atmosphere; and vacuum pipes 910 that are respectively connected to the vacuum pump 920, the scrubber 930, and the duct 940 and that are used to maintain a vacuum state or cause introduction and discharge of gases into and from the chamber.

Various gases used in semiconductor manufacturing processes are important process factors that directly impact the production of semiconductor products. However, those gases are likely to harm humans, or cause damage to equipment and systems when they are carelessly handled or used without safety devices. Therefore, a gas leak detecting means 960 such as a gas sensor may be further installed to detect a gas leak.

Flange-equipped ends of vacuum pipes 950 are connected to each other using a clamp 970 or a bellows 980 that can freely change a passage according to an error occurring during production of straight pipes. However, in the conventional art, a gas leak is detected in such a manner that an operator manually checks each of the pipe connections between vacuum pipes 950, which are connected using clamps, for a gas leak using a detector (ion detector, not illustrated).

In this case, there is no problem when the clamps 970 are precisely clamped to the connection portions of the vacuum pipes. However, since checking methods, checking positions, and checking environments are likely to be different according to each operator, it is difficult to precisely check for clamping state errors. When a toxic gas leaks during a semiconductor manufacturing process due to a fault of a manufacturing apparatus or a sealing fault at the pipe connection between the vacuum pipe 950, not only manufacturing apparatuses and systems are damaged but also operator heath is put at risk.

Hereinafter, some implementations of the disclosed technology will be described with reference to the accompanying drawings.

Figure 2:
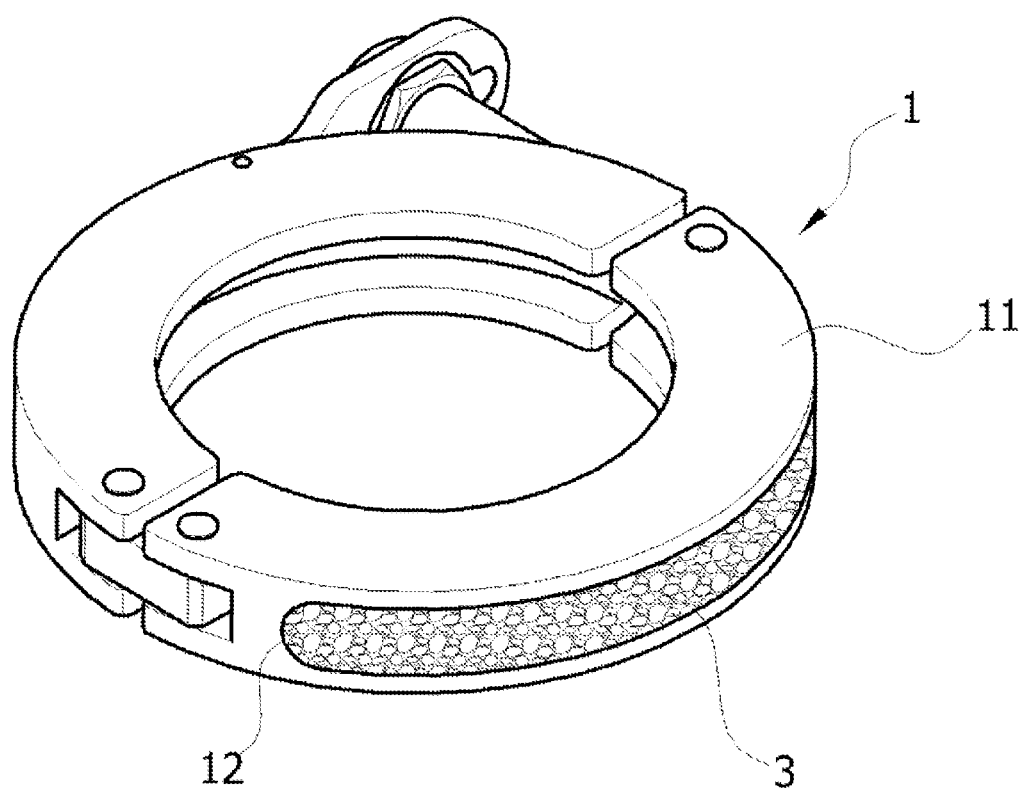
FIGS. 2 and 3 are perspective views illustrating a clamp serving as a vacuum pipe connecting member capable of detecting a gas leak according to one embodiment of the disclosed technology.
Figure 3:
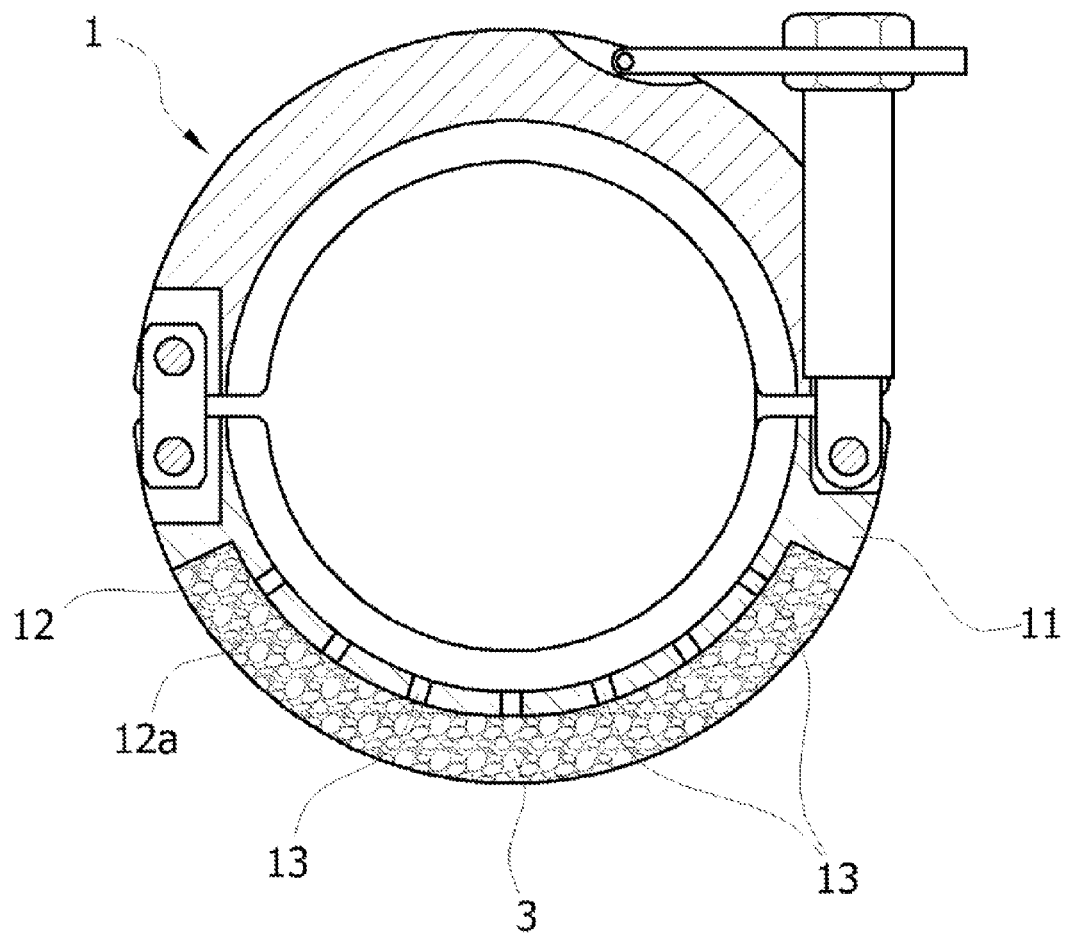
Figure 4:
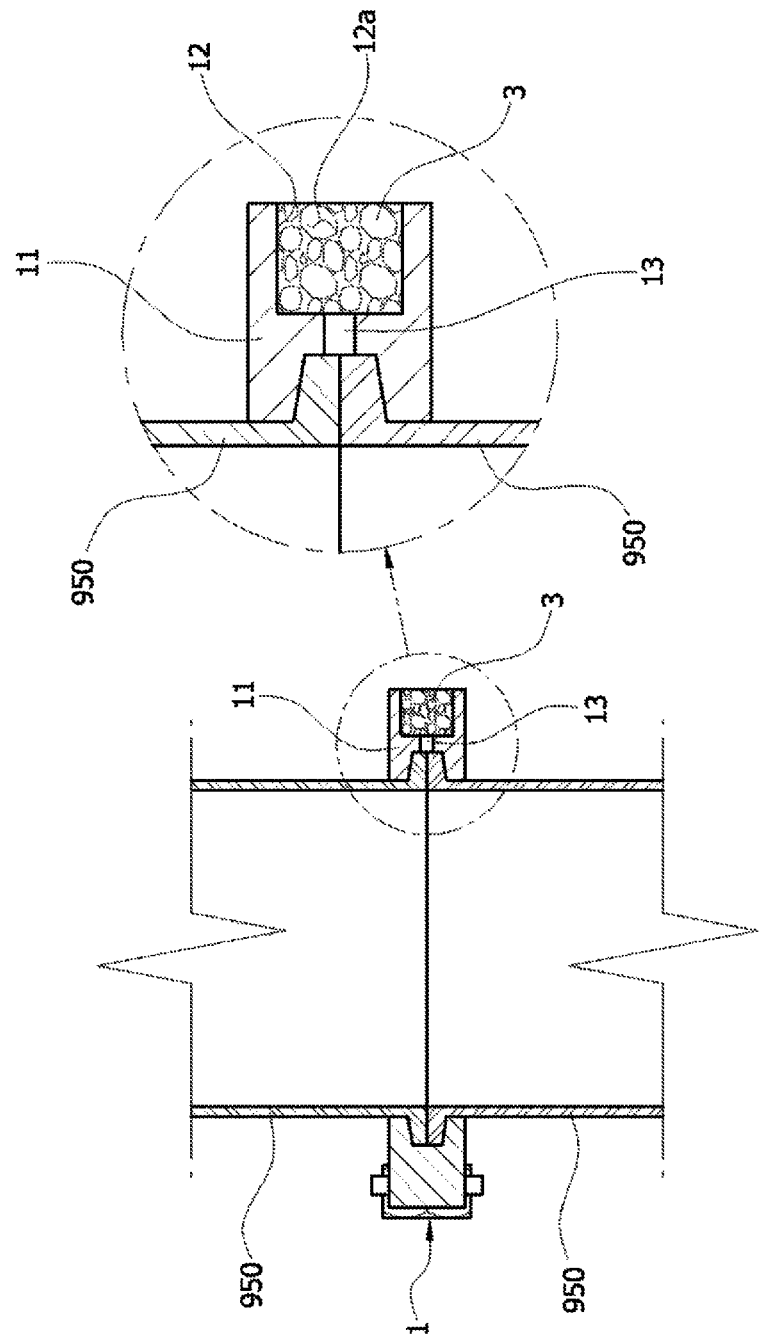
FIG. 4 is a cross-sectional view of a pipe connection portion of a vacuum pipe to which a clamp serving as a vacuum pipe connecting member capable of detecting a gas leak according to one embodiment of the disclosed technology is applied.
Figure 5:
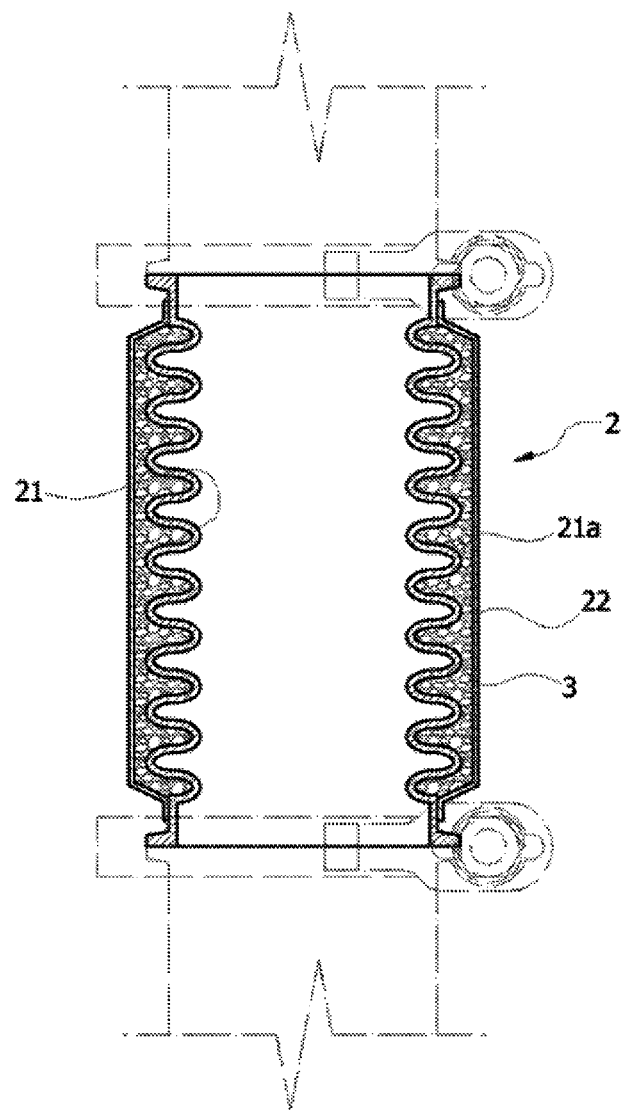
FIG. 5 is a cross-sectional view of a pipe connection portion of a vacuum pipe to which a bellows serving as a vacuum pipe connecting member capable of detecting a gas leak according to another embodiment of the disclosed technology is applied.
Figure 6:
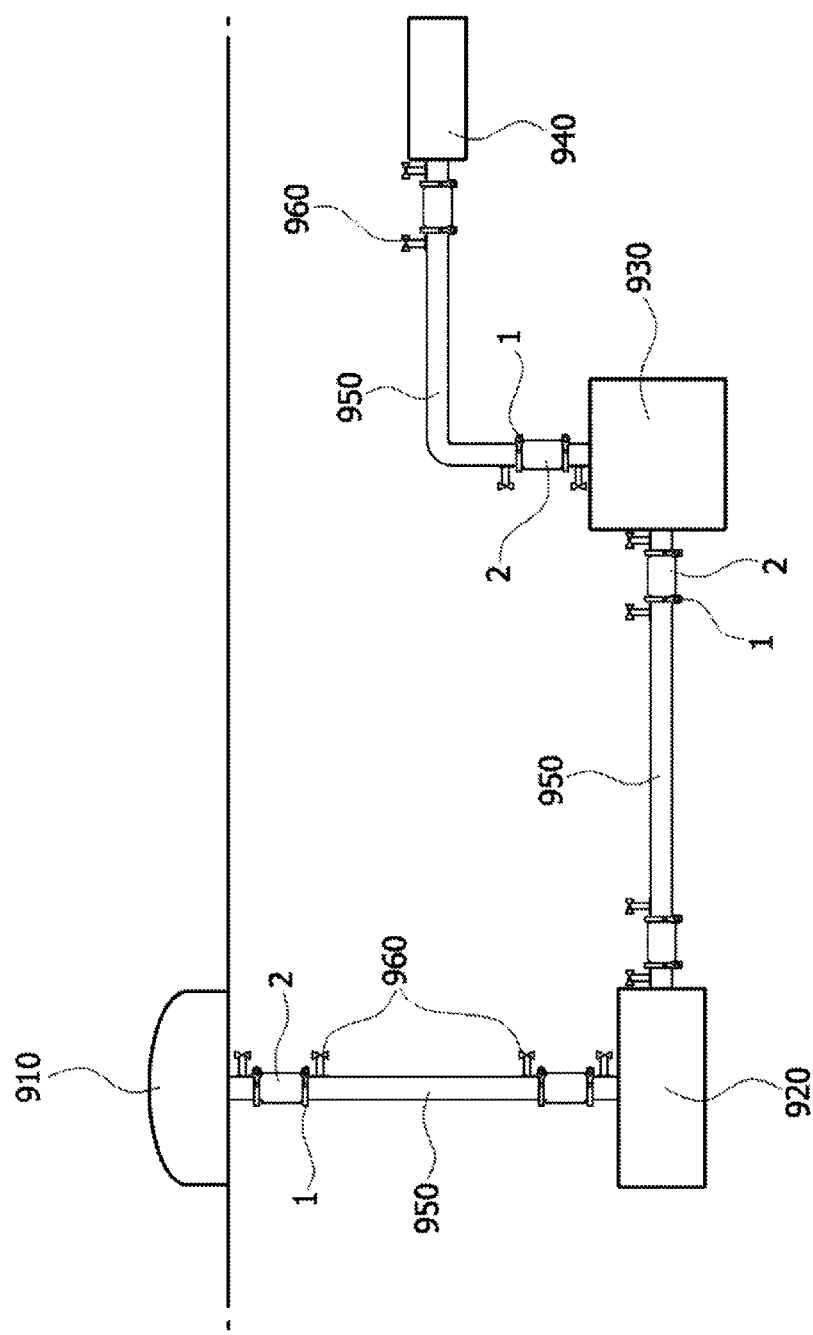
FIG. 6 is an exemplary diagram schematically illustrating a semiconductor manufacturing process facility in which a vacuum pipe connecting member capable of detecting a gas leak according to the disclosed technology is installed.

In the accompanying drawings, FIGS. 2 and 3 are perspective views illustrating the construction of a clamp serving as a vacuum pipe connecting member capable of detecting a gas leak according to one embodiment of the disclosed technology; FIG. 4 is a cross-sectional view of a main portion of a pipe connection of a vacuum pipe to which a clamp serving as a vacuum pipe connecting member capable of detecting a gas leak according to one embodiment of the disclosed technology is applied; FIG. 5 is a cross-sectional view of a main portion of a pipe connection of a vacuum pipe to which a bellows serving as a vacuum pipe connecting member capable of detecting a gas leak according to another embodiment of the present invention is applied; and FIG. 6 is an exemplary diagram schematically illustrating a semiconductor manufacturing process facility in which the vacuum pipe connecting member capable of detecting a gas leak according to the disclosed technology is installed.

As illustrated in FIG. 2, the vacuum pipe connecting member capable of detecting a gas leak according to the disclosed technology is a combination of either a clamp 1 or a bellows 2 and a reactant 3. The clamp is used for pipe fitting between vacuum pipes 950 or between a vacuum pipe 950 and a pipe of a semiconductor manufacturing apparatus. The bellows 2 is used for pipe fitting and can freely change a passage according to a clearance between pipes, the clearance being attributable to a pipe connection error occurring when straight pipes are connected. The reactant 3 is provided in the clamp 1 or bellows 2 and is chemically reactive to a gas leaking from the pipe connection.

As illustrated in FIGS. 3 and 4, the clamp 1 has a slit 12 in the outer circumferential surface of a coupling ring 11 that simultaneously surrounds ends of flange-equipped vacuum pipes 950 and/or ends of pipes of semiconductor manufacturing apparatuses in order to connect pipes to each other. In addition, the clamp 1 includes a storage portion 12a to be filled with the reactant 3, and a plurality of through holes 13 arranged at regular intervals within the slit 12. The through holes 12 each extend from the inner circumferential surface of the coupling ring 11 to the storage portion 12a.

As illustrated in FIG. 5, the bellows 2 has a corrugated portion 21 that can change the direction of a gas flow and a cover 22 that surrounds the entire area of the corrugated portion 21. Thanks to this structure, the storage portion 21a to be filled with the reactant 3 that is chemically reactive to a gas leaking from a pipe connection is provided outside the corrugated portion 21.

The cover 22 is preferably made of a transparent material to enable an operator to visually check for a chemical reaction of the reactant 3 from outside or with use of a detecting means 960 such as a color sensor.

The reactant 3 is used to check for a gas leak from a pipe connection. The reactant 3 is preferably a chemical having a composition that can react with any kinds of various process gases or clean gases used in semiconductor manufacturing processes (for example, arsine, silane, boron trichloride, and hydrogen bromide) and changes a color-changing reaction when reacting with such gases. However, the reactant 3 is not limited thereto.

That is, the reactant may be a gas composition that can cause a chemical reaction such as an isothermal or isobaric reaction by reacting with the gases. The reactant may be retained in the storage space 12a or 21a by means of a paper membrane that ruptures or is damaged when exposed to any one of the gases.

Operation of the gas-leak-detectable vacuum pipe connecting member having the above-described construction according to the disclosed technology will be described below.

As illustrated in FIG. 6, when installing the vacuum pipe connecting member capable of detecting a gas leak according to the disclosed technology, each connecting member may be further provided with a detecting means 960 such as a color sensor that can detect a chemical reaction of the reactant 3 or a photodetector that detects light energy as spectrum.

A monitoring device that can display a signal transferred from the detecting means 960, which detects a chemical reaction of the reactant 3 on a screen, is additionally installed. This monitoring device enables an operator to remotely confirm a gas leak in real time from a semiconductor manufacturing process facility. Therefore, the operator can promptly take measures to fix the gas leak when the gas leak occurs.

In this state, when performing pipe-fitting between vacuum pipes 950 or between a vacuum pipe 950 and a pipe of a semiconductor manufacturing apparatus using the clamp 1 with the storage portion 12a filled with the reactant 3, as illustrated in FIG. 4, an operator first arranges ends of flange-equipped pipes to face each other, and then connects the pipes to each other by simultaneously surrounding the ends of the pipes using the coupling ring 11. Next, a gas passes through a scrubber 930 via the vacuum pipes 950 when a vacuum pump 920 operates during a semiconductor manufacturing process so that a vacuum state is created in a chamber 910. Through this process, contaminants detached from the chamber 910 are finally released into the atmosphere through a duct 940.

At this time, a gas may leak from a pipe connection due to a pressure of the vacuum pump 920. When the gas leak occurs, the leaking gas flows into the storage portion 12a via the through hole 13 of the coupling ring 11. At this time, the reactant 3 causes a chemical reaction.

Therefore, an operator can directly and visually check for a chemical reaction of the reactant 3 or can easily, remotely confirm a gas leak using an additional monitoring system.

Similarly, in the case of using the bellows 2 in order to change a gas flow passage according to a clearance between pipes attributable to a production error of straight pipes, as illustrated in FIG. 5, the reactant 3 stored in the storage portion 21a that is provided by covering the corrugated portion 31 of the bellows 3 with the cover 22, reacts with a gas that enters into the storage portion 21a through a crack which is created by corrosion or damage. Therefore, it is possible to easily confirm a gas leak by checking for the chemical reaction In conclusion, a person (operator) directly confirms whether the reactant 3 in the clamp 1 or bellows 2 caused a chemical reaction through the above-described process. Even without an operator, a gas leak can be remotely checked in real time using an additional monitoring system. Therefore, it is possible to promptly take measures to fix the gas leak.

Although the disclosed technology has been described in detail with reference the preferred embodiments as described above, other implementations are also possible. Additionally, those skilled in the art will appreciate that various modifications, additions and substitutions are possible, without departing from the scope and spirit of the disclosed technology.

The invention claimed is:

1. A vacuum pipe connecting member for detecting a gas leak, the vacuum pipe connecting member comprising:
    a clamp for connecting a first pipe and a second pipe or the first pipe and a semiconductor manufacturing apparatus, the clamp comprising a coupling ring surrounding a pipe connection area between one end of the first pipe and one end of the second pipe or between the one end of the first pipe and one end of the semiconductor manufacturing apparatus, wherein a slit is formed on an outer circumferential surface of the coupling ring and the slit defines a space of a storage portion, a plurality of through holes are extended from the storage portion to an inner circumferential surface of the coupling ring, the inner circumferential surface of the coupling ring is connected to the pipe connection area; and
    a reactant comprising a chemical having a composition that causes a color-changing reaction when the reactant chemically reacts with the leaking gas, wherein the reactant is disposed in the storage portion and is chemically reactive to a gas leaking from the pipe connection area.

2. The vacuum pipe connecting member of claim 1, wherein the reactant includes a gas composition that is chemically reactive to the leaking gas.

3. The vacuum pipe connecting member of claim 1, wherein one end of each of the plurality of through holes is defined to face the pipe connection area and another end of each of the plurality of through holes is connected to the storage portion.

4. The vacuum pipe connecting member of claim 1, wherein a width of the storage portion is greater than that of each of the plurality of through holes.

5. The vacuum pipe connecting member of claim 1, wherein the plurality of through holes are arranged at regular intervals within the storage portion.

6. The vacuum pipe connecting member of claim 1, wherein the storage portion is filled with the reactant.

\* \* \* \* \*